United States Patent
Izutani et al.

(10) Patent No.: US 11,867,768 B2
(45) Date of Patent: Jan. 9, 2024

(54) BATTERY VOLTAGE MEASUREMENT CIRCUIT

(71) Applicant: DENSO TEN Limited, Kobe (JP)

(72) Inventors: Atsushi Izutani, Kobe (JP); Yoshihiro Nakao, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 17/871,352

(22) Filed: Jul. 22, 2022

(65) Prior Publication Data

US 2023/0236254 A1 Jul. 27, 2023

(30) Foreign Application Priority Data

Jan. 21, 2022 (JP) .................. 2022-008115

(51) Int. Cl.
*G01R 31/385* (2019.01)
*G01R 19/10* (2006.01)

(52) U.S. Cl.
CPC .......... *G01R 31/385* (2019.01); *G01R 19/10* (2013.01)

(58) Field of Classification Search
CPC .. G01R 31/385; G01R 19/10; G01R 31/3842; G01R 31/3648; H01M 10/4285; H01M 10/48; H02J 7/0029

USPC ............ 324/415, 425–434, 76.11, 126, 500, 324/756.05, 538

See application file for complete search history.

(56) References Cited

U.S. PATENT DOCUMENTS

2004/0189330 A1* 9/2004 Herb ..................... G01R 27/18
324/691
2013/0067256 A1* 3/2013 Shiraishi ............... H01M 10/48
713/320

FOREIGN PATENT DOCUMENTS

JP 2003-066090 A 3/2003

* cited by examiner

*Primary Examiner* — Lee E Rodak
*Assistant Examiner* — Trung Q Nguyen
(74) *Attorney, Agent, or Firm* — Oliff PLC

(57) ABSTRACT

A battery voltage measurement circuit includes: a first switch configured to be connected to a positive electrode of a battery; a second switch configured to be connected to a negative electrode of the battery; detection resistances that are connected in series between the first switch and the second switch; capacitors that are connected in parallel to the detection resistances; and a measurement circuit that measures a voltage applied to the detection resistances. The battery voltage measurement circuit has a plurality of measurement modes depending upon status of the first and second switches, and further has a failure detection mode for the capacitors based on a change in the voltage after switching from one to an other of the measurement modes.

16 Claims, 19 Drawing Sheets

BATTERY VOLTAGE MEASUREMENT CIRCUIT

BACKGROUND OF THE INVENTION

Field of the Invention

The invention relates to a battery voltage measurement circuit and a failure detection method.

Description of the Background Art

There is an insulation resistance detection apparatus that includes a measurement portion having a first switch connected to a positive electrode of a battery, a second switch connected to a negative electrode of the battery, detection resistances, and a measurement circuit that measures a voltage applied to the detection resistances and detects an insulation resistance of the battery (for example, refer to Japanese Published Unexamined Patent Application No. 2003-66090).

The insulation resistance detection apparatus turns on one of the first switch and the second switch and turns off an other one of the first switch and the second switch to form a series-connected circuit consisting of the battery, the insulation resistances of the battery, and the detection resistances, and detects the insulation resistance of the battery based on the voltage measured by the measurement circuit. In the insulation resistance detection apparatus, it is desirable that capacitors be connected in parallel to the detection resistances to stabilize the voltage applied to the detection resistances.

However, in the insulation resistance detection apparatus, when an open failure occurs in the capacitors, the voltage applied to the detection resistances becomes unstable, so that detection accuracy of the insulation resistance decreases.

SUMMARY OF THE INVENTION

According to one aspect of the invention, a battery voltage measurement circuit includes: a first switch configured to be connected to a positive electrode of a battery; a second switch configured to be connected to a negative electrode of the battery; detection resistances that are connected in series between the first switch and the second switch; capacitors that are connected in parallel to the detection resistances; and a measurement circuit that measures a voltage applied to the detection resistances. The battery voltage measurement circuit has a plurality of measurement modes depending upon status of the first and second switches, and further has a failure detection mode for the capacitors based on a change in the voltage after switching from one to an other of the measurement modes.

It is an object of the invention to provide a failure detection apparatus capable of improving a detection accuracy of an insulation resistance.

These and other objects, features, aspects and advantages of the invention will become more apparent from the following detailed description of the invention when taken in conjunction with the accompanying drawings.

DESCRIPTION OF THE EMBODIMENTS

An insulation resistance detection apparatus according to an embodiment will be described below in detail with reference to the accompanying drawings. In addition, this invention is not limited to the embodiment described below. The insulation resistance detection apparatus according to the embodiment that is also a battery voltage measurement circuit or a failure detection apparatus is mounted on, for example, a vehicle traveling using a driving force of an electric motor, such as an electric vehicle, a hybrid vehicle, or the like.

A high voltage secondary battery (e.g., lithium ion battery) that outputs a high voltage of several 100 V or more is used for a battery that supplies an electric power to the electric motor of the vehicle. Such a battery may cause an electric shock due to an electric leakage.

Thus, the battery is stored in an insulating case, or the like, and is electrically insulated from an outside of the case. The case of the battery is an insulation member that comes into electrical contact with the battery. In a new condition, the case has a resistance value of several M Ω and hardly conducts electricity. However, an insulation performance of the case of the battery may deteriorate, for example, due to a secular change, and the like. As a result, the insulation resistance detection apparatus detects and monitors an insulation resistance of the case that is an insulation resistance of the battery.

1. Configuration Example of Insulation Detection Apparatus

Figure 1:
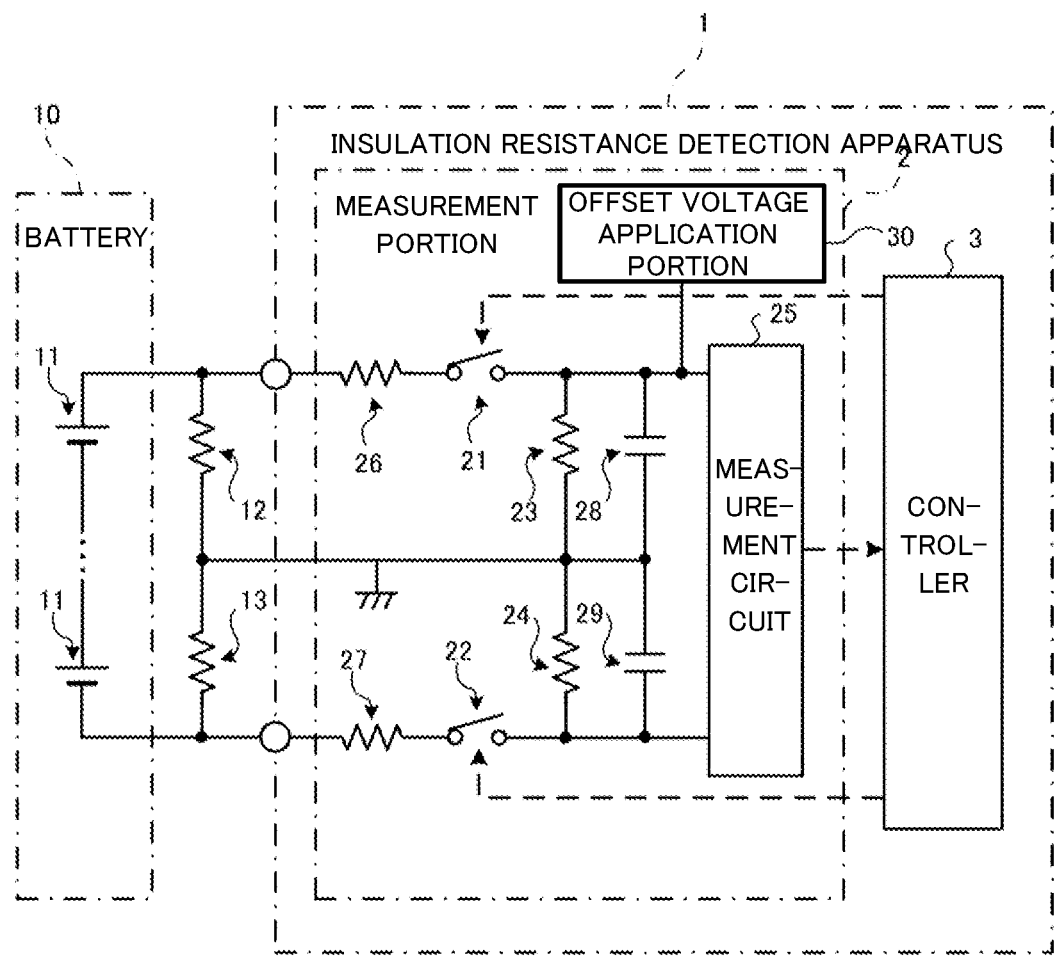
FIG. 1 is an explanation diagram illustrating a configuration example of an insulation resistance detection apparatus according to an embodiment.

FIG. 1 is an explanation diagram illustrating a configuration example of an insulation resistance detection apparatus 1 according to the embodiment. As illustrated in FIG. 1, the insulation resistance detection apparatus 1 is connected to a battery 10 via an insulation resistance 12 on a positive electrode side and an insulation resistance 13 on a negative electrode side. The battery 10 includes a plurality of battery cells 11 that are connected in series.

The insulation resistance 12 on the positive electrode side and the insulation resistance 13 on the negative electrode side are not resistance elements but a part of the insulating case in which the battery 10 is stored. That is, the insulation resistance 12 on the positive electrode side is an insulation resistance of a part of the case (insulation member on the positive electrode side) that comes into electrical contact with the positive electrode of the battery. The insulation resistance 13 on the negative electrode side is an insulation resistance of a part of the case (insulation member on the negative electrode side) that comes into electrical contact with the negative electrode of the battery. The insulation resistance 12 on the positive electrode side and the insulation resistance 13 on the negative electrode side may be resistance elements to be provided to electrically insulate the battery 10 from the outside of the battery 10.

The insulation resistance detection apparatus 1 includes a measurement portion 2 and a controller 3. The measurement portion 2 includes a first switch 21 to be connected to a positive electrode of the battery 10, a second switch 22 to be connected to a negative electrode of the battery 10, detection resistances 23, 24, and a measurement circuit 25 that measures a voltage applied to the detection resistances 23, 24. The measurement portion 2 further includes control resistances 26, 27, capacitors 28, 29 to be connected in parallel to the detection resistances 23, 24, and an offset voltage application portion 30. The offset voltage application portion 30 applies a predetermined offset voltage to a connecting line that connects the first switch 21 and the measurement circuit 25.

The controller 3 includes a microcomputer having a CPU (Central Processing Unit), a ROM (Read Only Memory), a RAM (Random Access Memory), and the like, and various circuits. The controller 3, for example, the CPU uses the RAM as a work area to execute a program stored in the ROM. Thus, the controller 3 controls the first switch 21 and the second switch 22.

The controller 3 turns on one of the first switch 21 and the second switch 22, and turns off an other one of the first switch 21 and the second switch 22 to form a series-connected circuit consisting of the battery 10, the insulation resistances 12, 13 of the battery 10, and the detection resistances 23, 24, and calculates the insulation resistances 12, 13 based on the voltage measured by the measurement circuit 25. Specific examples of operations of the controller 3 will be described later with reference to FIG. 2 and FIG. 3.

A part or entire of the controller 3 may be constituted of hardware such as an ASIC (Application Specific Integrated Circuit) and an FPGA (Field Programmable Gate Array).

2. Operation when Detecting Insulation Resistance

Figure 2:
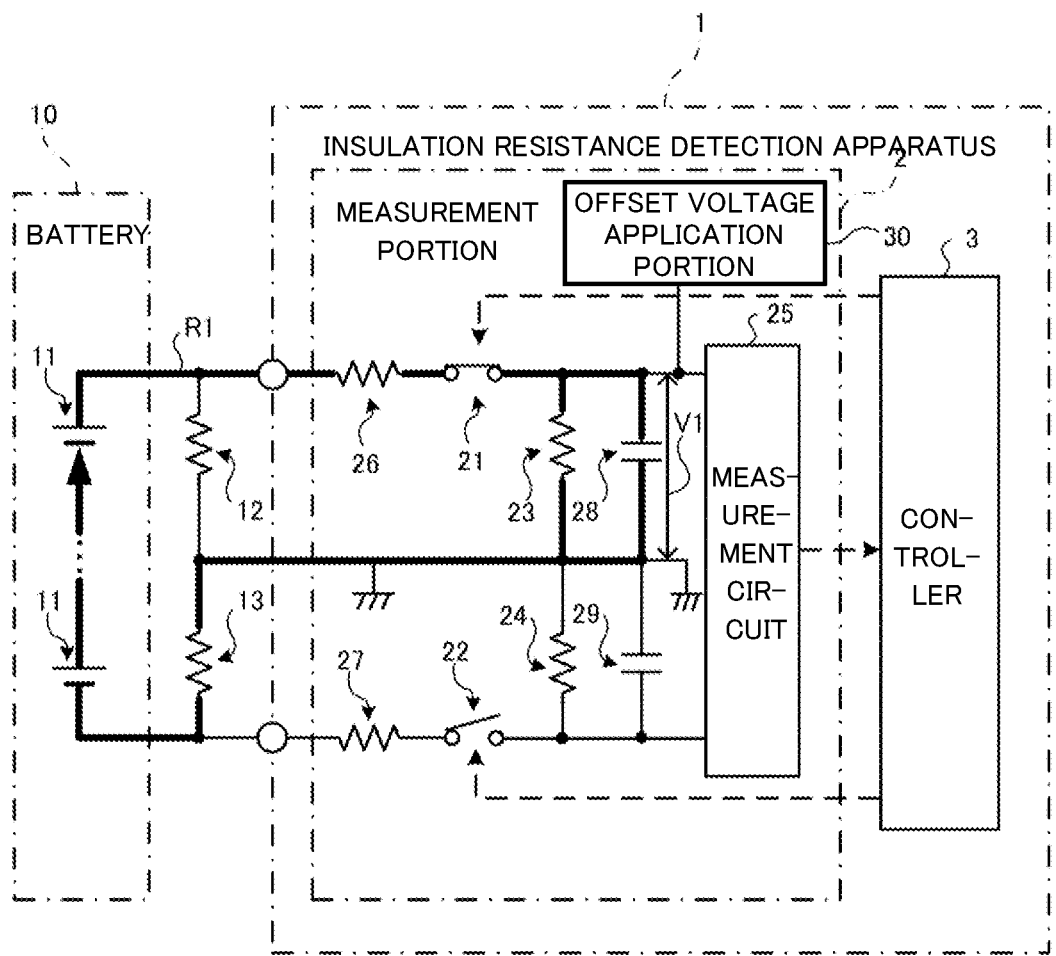
FIG. 2 is an explanation diagram illustrating an operation example of the insulation resistance detection apparatus according to the embodiment.
Figure 3:
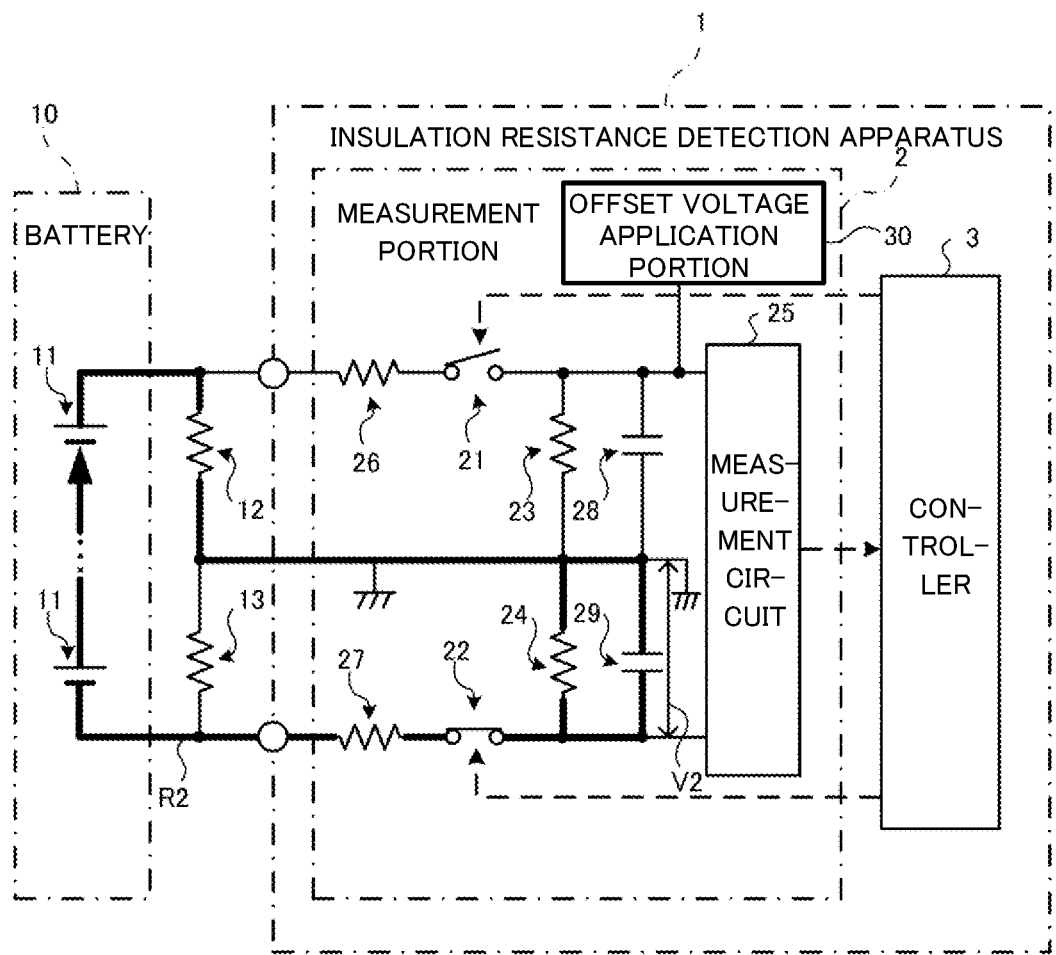
FIG. 3 is an explanation diagram illustrating an operation example of the insulation resistance detection apparatus according to the embodiment.

Next, operations of the insulation resistance detection apparatus 1 when detecting insulation resistances will be described with reference to FIG. 2 and FIG. 3. FIG. 2 and FIG. 3 are explanation diagrams illustrating operation examples of the insulation resistance detection apparatus 1 according to the embodiment.

For example, when detecting a resistance value of the insulation resistance 13 on the negative electrode side, as illustrated in FIG. 2, the controller 3, as a first measurement mode, turns on the first switch 21 and turns off the second switch 22 to form a first series-connected circuit R1 consisting of the battery 10, the detection resistance 23, and the insulation resistance 13 on the negative electrode side of the battery 10. Thus, the controller 3 performs a first measurement process of calculating the insulation resistance 13 on the negative electrode side based on a first voltage V1 measured by the measurement circuit 25. Then, the measurement circuit 25 measures the first voltage V1 applied to the detection resistance 23 (voltage difference between both ends of the detection resistance 23), and outputs the measurement result to the controller 3.

At this time, when the resistance value of the insulation resistance 13 on the negative electrode side is sufficiently high, a current hardly flows through the first series-connected circuit R1. In this case, the first voltage V1 measured by the measurement circuit 25 has a value close to 0V. On the other hand, when the resistance value of the insulation resistance 13 on the negative electrode side decreases, a current flows through the first series-connected circuit R1. Then, the first voltage V1 measured by the measurement circuit 25 has a higher value as the resistance value of the insulation resistance 13 on the negative electrode side decreases.

Thus, the controller 3 calculates the resistance value of the insulation resistance 13 on the negative electrode side based on the first voltage V1 measured by the measurement circuit 25. When the calculated resistance value is a predetermined resistance value or more, the controller 3 determines that there is no electric leakage. Furthermore, when the calculated resistance value is less than the predetermined resistance value, the controller 3 determines that there is an electric leakage. When the controller 3 has determined that there is an electric leakage, the controller 3 warns a user about the fact by using a warning device such as a warning light.

For example, when detecting a resistance value of the insulation resistance 12 on the positive electrode side, as illustrated in FIG. 3, the controller 3, as a second measurement mode, turns off the first switch 21 and turns on the second switch 22 to form a second series-connected circuit R2 consisting of the battery 10, the detection resistance 23, and the insulation resistance 12 on the positive electrode side of the battery 10. Thus, the controller 3 performs a second measurement process of calculating the insulation resistance 12 on the positive electrode side based on a second voltage V2 measured by the measurement circuit 25. Then, the measurement circuit 25 measures the second voltage V2 applied to the detection resistance 24 (voltage difference between both ends of the detection resistance 24), and outputs the measurement result to the controller 3.

At this time, when the resistance value of the insulation resistance 12 on the positive electrode side is sufficiently high, a current hardly flows through the second series-connected circuit R2. In this case, the second voltage V2 measured by the measurement circuit 25 has a value close to 0V. On the other hand, when the resistance value of the insulation resistance 12 on the positive electrode side decreases, a current flows through the second series-connected circuit R2. Then, the second voltage V2 measured by the measurement circuit 25 has a higher value as the resistance value of the insulation resistance 12 on the positive electrode side decreases.

Thus, the controller 3 calculates the resistance value of the insulation resistance 12 on the positive electrode side based on the second voltage V2 measured by the measurement circuit 25. When the calculated resistance value is the predetermined resistance value or more, the controller 3 determines that there is no electric leakage. Furthermore, when the calculated resistance value is less than the predetermined resistance value, the controller 3 determines that there is an electric leakage. When the controller 3 has determined that there is an electric leakage, the controller 3 warns a user about the fact by using a warning device such as a warning light.

Here, the capacitors 28, 29 are provided to smooth noise components contained in the voltage applied to the detection resistances 23, 24, and stabilize the voltage applied to the detection resistances 23, 24. Thus, for example, when an open failure occurs in the capacitors 28, 29, the measurement result of the voltage measured by the measurement portion 2 becomes unstable, and detection accuracy of the insulation resistances 12, 13 decreases. Therefore, the controller 3 of the insulation resistance detection apparatus 1 according to the embodiment conducts an inspection whether or not the capacitors 28, 29 are broken down.

3. Inspection Method of Capacitor

Next, an inspection method of the capacitors 28, 29 according to the embodiment will be described with reference to FIG. 4 to FIG. 13. Each of FIG. 4 to FIG. 13 is an explanation diagram of the inspection method of the capacitors according to the embodiment. Here, in a state in which the insulation resistance 12 on the positive electrode side and the insulation resistance 13 on the negative electrode side are not deteriorated, a case in which an insulation resistance value of the insulation resistance 12 is the same as an insulation resistance value of the insulation resistance 13 will be described.

The controller 3 performs a detection of the insulation resistances described above and an inspection of the capacitors 28, 29 in a series of operations described later. Specifically, the controller 3 sequentially and repeatedly executes the first measurement process (refer to FIG. 2), the second measurement process (refer to FIG. 3), and a third measurement process that will be described with reference to FIG. 4 to conduct the inspection of the capacitors 28, 29.

Figure 4:
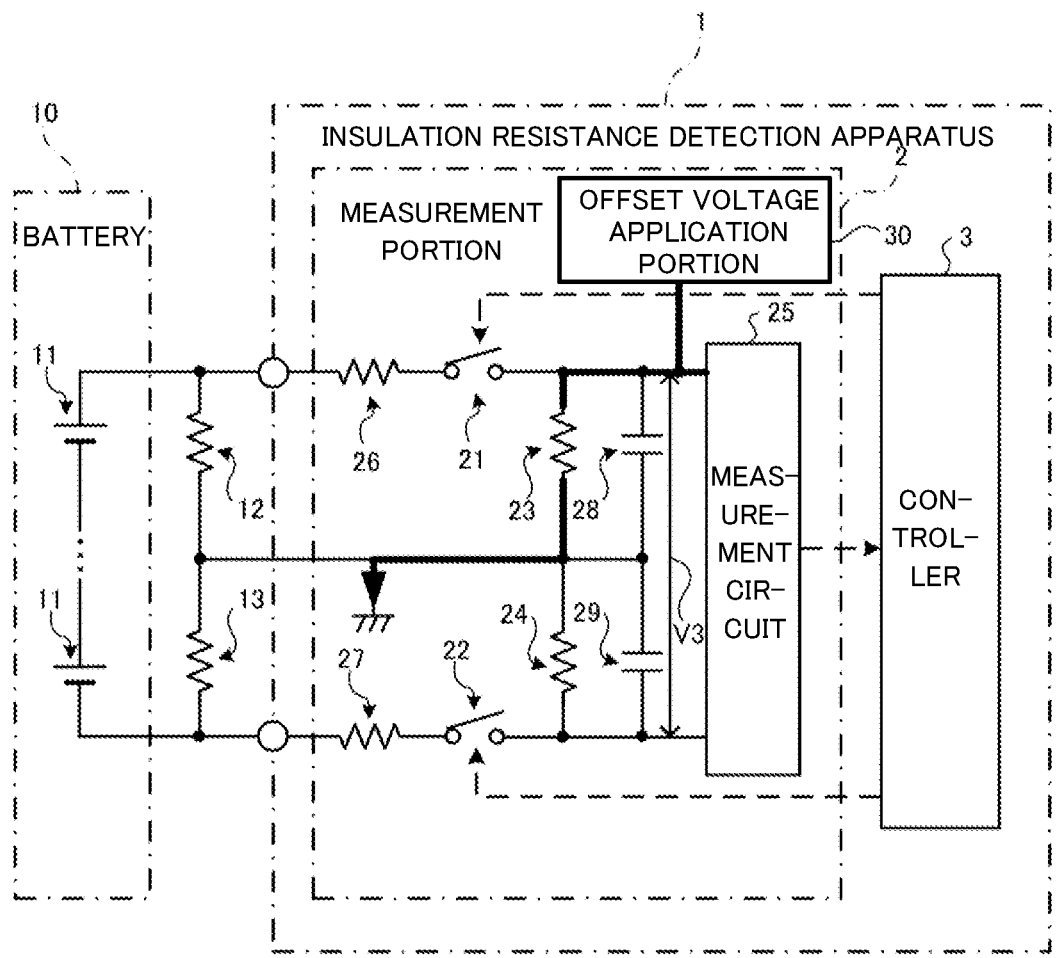
FIG. 4 is an explanation diagram of an inspection method of capacitors according to the embodiment.

As illustrated in FIG. 4, the controller 3, as a third measurement mode, turns off the first switch 21 and the second switch 22 to perform the third measurement process of calculating an offset voltage based on a third voltage V3 measured by the measurement circuit 25.

Then, the controller 3, as a failure detection mode, detects a change in the voltage measured by the measurement circuit 25 after switching from one measurement process to another measurement process of the first measurement process, the second measurement process, and the third measurement process, and detects failures of the capacitors 28, 29 based on the change in the voltage. In addition, the controller 3 may have at least two measurement processes of the first measurement process, the second measurement process, and the third measurement process.

Figure 5:
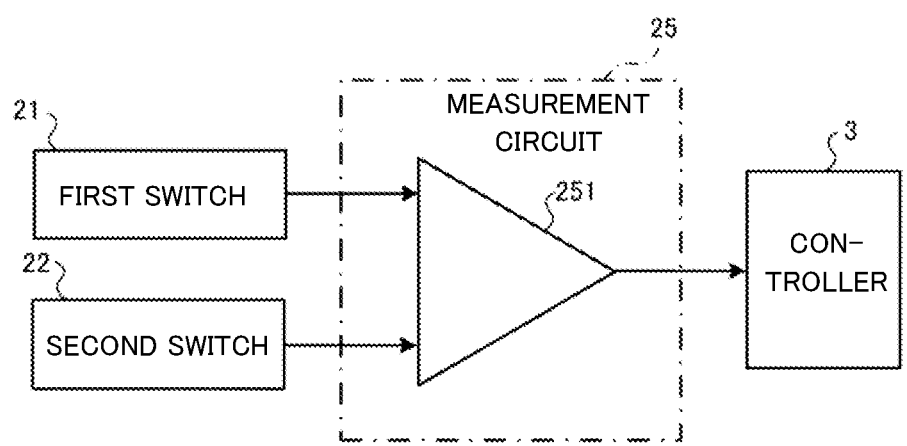
FIG. 5 is an explanation diagram of the inspection method of the capacitors according to the embodiment.

The measurement circuit 25 includes, for example, a differential amplifier 251 illustrated in FIG. 5. As illustrated in FIG. 5, the differential amplifier 251 outputs a voltage corresponding to a difference between a voltage of a wire connected to the first switch 21 and a voltage of a wire connected to the second switch 22 to the controller 3. As described above, the measurement circuit 25 includes the differential amplifier 251 that differentially amplifies the first voltage V1 and the second voltage V2. As a result, since the insulation resistance detection apparatus 1 detects a measurement voltage by using one differential amplifier 251, it is possible to reduce costs of the measurement circuit 25.

Figure 6:
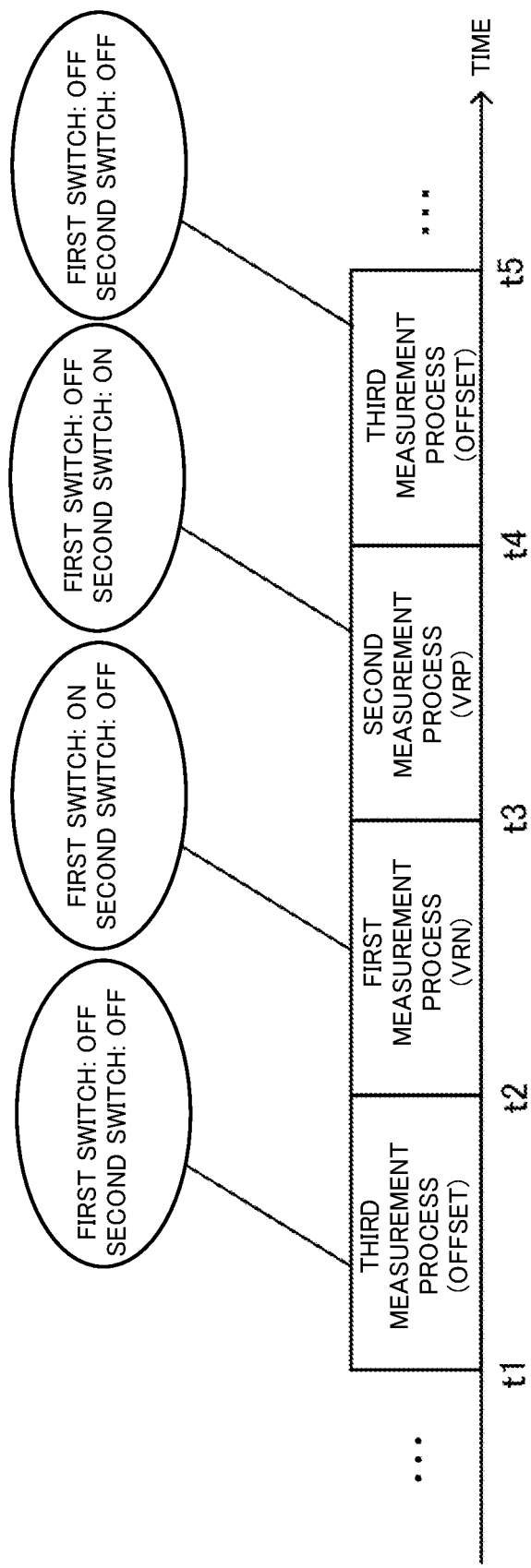
FIG. 6 is an explanation diagram of the inspection method of the capacitors according to the embodiment.

Then, for example, the controller 3 conducts the inspection of the capacitors 28, 29 according to a measurement schedule shown in FIG. 6. As illustrated in FIG. 6, the controller 3 performs the third measurement process during a period from a time t1 to a time t2. In the third measurement process, the controller 3 turns off the first switch 21 and the second switch 22 to measure the voltage measured by the measurement circuit 25.

The controller 3 performs the first measurement process during a period from the time t2 to a time t3. In the first measurement process, the controller 3 turns on the first switch 21 and turns off the second switch 22 to measure the voltage measured by the measurement circuit 25. The controller 3 performs the second measurement process during a period from the time t3 to a time t4. In the second measurement process, the controller 3 turns off the first switch 21 and turns on the second switch 22 to measure the voltage measured by the measurement circuit 25. Subsequently, the controller 3 sequentially repeats the measurement processes in the order of the third measurement process, the first measurement process, and the second measurement process.

In the measurement portion 2, in a normal state in which the capacitors 28, 29 are not disconnected, when switching from the third measurement process to the first measurement process at the time t2, the capacitor 28 is charged. Subsequentially, when switching from the first measurement process to the second measurement process at the time t3, the capacitor 28 is discharged, and the capacitor 29 is charged. Subsequentially, when switching from the second measurement process to the third measurement process, the capacitor 29 is discharged.

Figure 7:
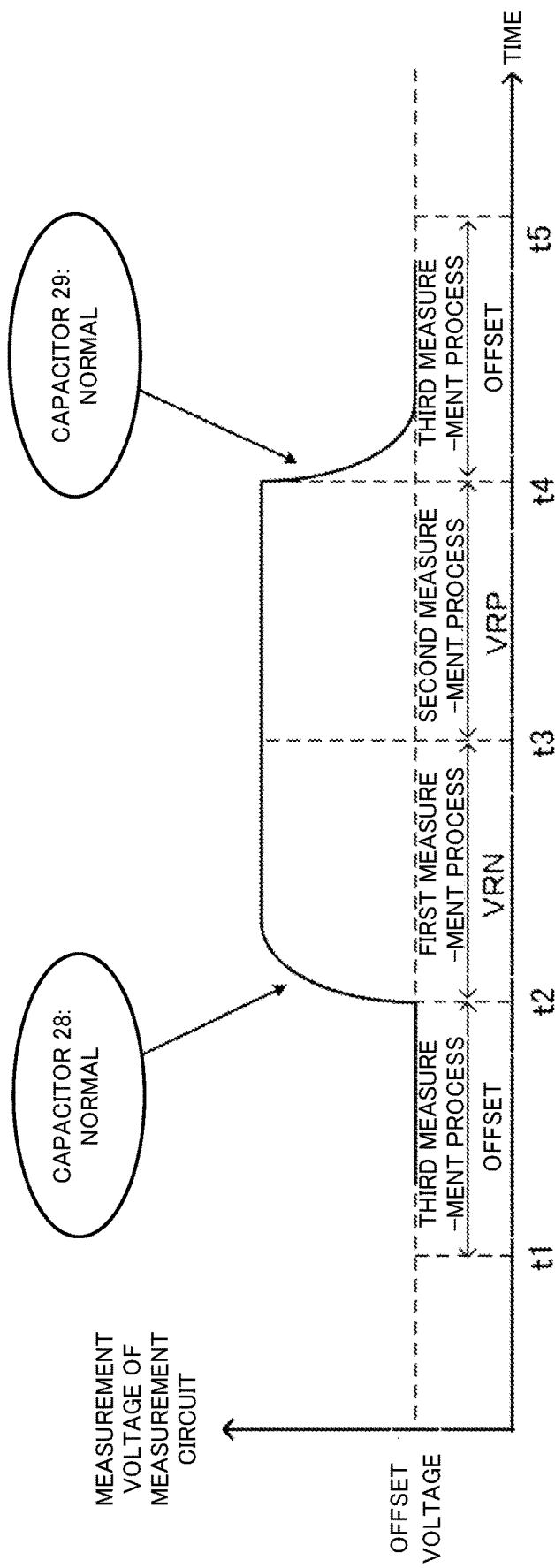
FIG. 7 is an explanation diagram of the inspection method of the capacitors according to the embodiment.

Thus, when the capacitors 28, 29 are in the normal state, as illustrated in FIG. 7, the voltage measured by the measurement circuit 25 (hereinafter, may be referred to as a "measured voltage") gradually increases from the time t2 to a completion of the charge of the capacitor 28. Furthermore, the measured voltage gradually decreases from the time t4 to a completion of the discharge of the capacitor 29.

Therefore, when the measured voltage gradually increases from the time t2, the controller 3 determines that the capacitor 28 is normal. Furthermore, when the measured voltage gradually decreases from the time t4, the controller 3 determines that the capacitor 29 is normal.

Figure 8:
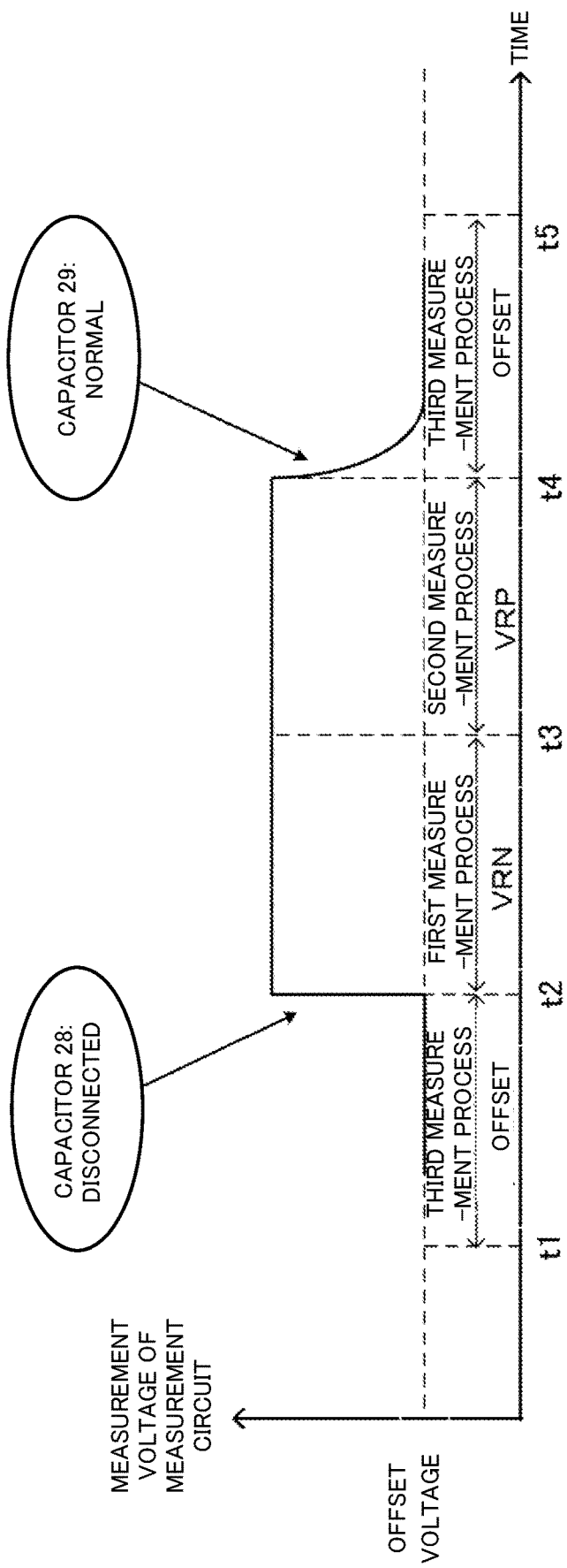
FIG. 8 is an explanation diagram of the inspection method of the capacitors according to the embodiment.

On the other hand, for example, when the capacitor 28 is disconnected, as illustrated in FIG. 8, the measured voltage rapidly increases at the time t2 because the capacitor 28 is not charged. Therefore, when the measured voltage rapidly increases at the time t2, the controller 3 determines that the capacitor 28 is disconnected.

Figure 9:
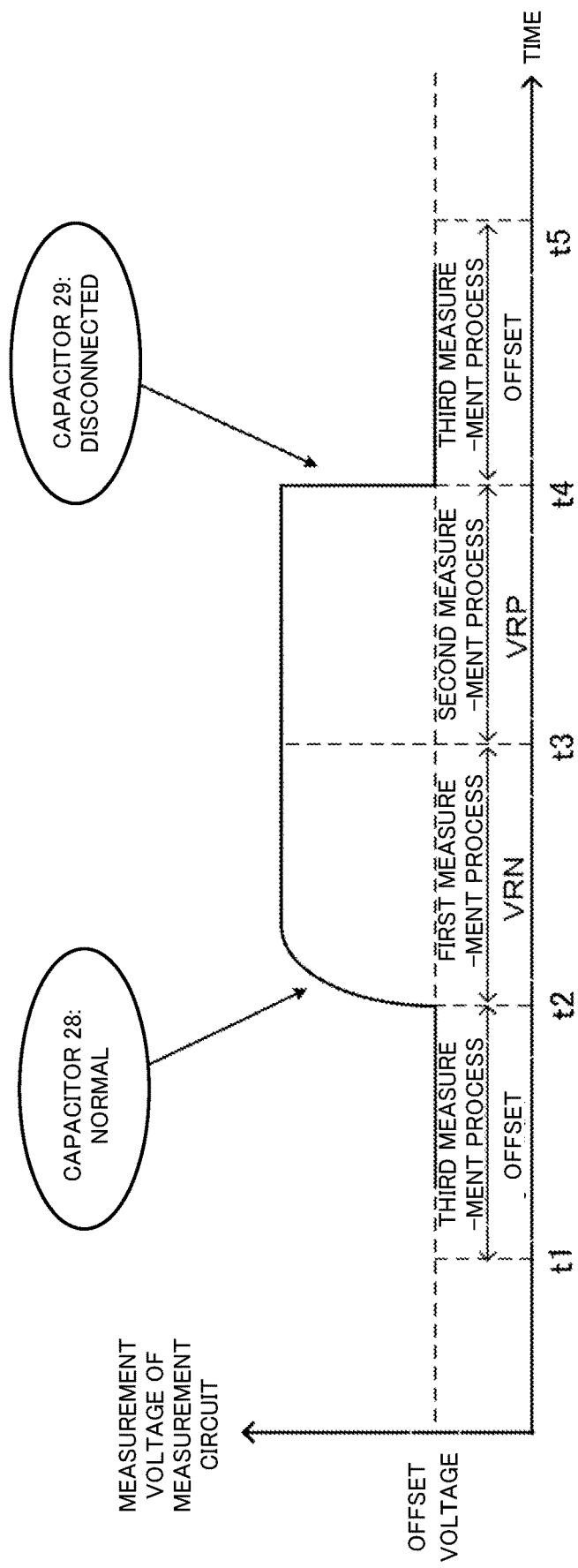
FIG. 9 is an explanation diagram of the inspection method of the capacitors according to the embodiment.

For example, when the capacitor 29 is disconnected, as illustrated in FIG. 9, the measured voltage rapidly decreases at the time t4 because the capacitor 28 is not discharged. Therefore, when the measured voltage rapidly decreases at the time t4, the controller 3 determines that the capacitor 29 is disconnected.

As described above, the controller 3 inspects the capacitors 28, 29 depending on whether the change in the voltage measured by the measurement circuit 25 after switching from the one measurement process to the other measurement process of the first measurement process, the second measurement process, and the third measurement process is slow or rapid.

More specifically, when a time until the voltage measured by the measurement circuit 25 stabilizes after switching from the one measurement process to the other measurement process of the first measurement process, the second measurement process, and the third measurement process is a predetermined time or less, the controller 3 determines that the capacitors 28, 29 are broken down.

Furthermore, when the time until the voltage measured by the measurement circuit 25 stabilizes after switching from the one measurement process to the other measurement process of the first measurement process, the second measurement process, and the third measurement process is more than the predetermined time, the controller 3 determines that the capacitors 28, 29 are not broken down.

At this time, the controller 3 detects the failures of the capacitors 28, 29 based on at least either a time during which the voltage measured by the measurement circuit 25 starts increasing and then stabilizes or a time during which the voltage measured by the measurement circuit 25 starts decreasing and then stabilizes.

Thus, the controller 3 accurately detects a presence or absence of the failures of the capacitors 28, 29. The controller 3 also detects the presence or absence of the failures of the capacitors 28, 29 based on a changing speed of the voltage measured by the measurement circuit 25 after switching from the one measurement process to the other measurement process of the first measurement process, the second measurement process, and the third measurement process.

In this case, when the changing speed of the voltage is a predetermined speed or more, the controller 3 determines that the capacitors 28, 29 are broken down. When the changing speed of the voltage is less than the predetermined speed, the controller 3 determines that the capacitors 28, 29 are not broken down.

Furthermore, the controller 3 detects the change in the voltage measured by the measurement circuit 25 a plurality of times in a shorter period than a normal period after switching from the one measurement process to the other measurement process of the first measurement process, the second measurement process, and the third measurement process.

Specifically, the measurement circuit 25, in a normal time, uses a predetermined time until the voltage applied to the detection resistances 23, 24 surely stabilizes after switching from the one measurement process to the other measurement process of the first measurement process, the second measurement process, and the third measurement process as one period to detect the voltage.

When the measurement circuit 25 conducts a failure inspection of the capacitors 28, 29, the measurement circuit 25 detects a voltage a plurality of times in the one period described above and outputs the detected voltage to the controller 3. Thus, the controller 3 accurately calculates the changing speed in an extremely short period of the voltage applied to the detection resistances 23, 24. As a result, the controller 3 determines the presence or absence of the failures of the capacitors 28, 29 before the voltage applied to the detection resistances 23, 24 starts changing and then stabilizes.

Figure 10:
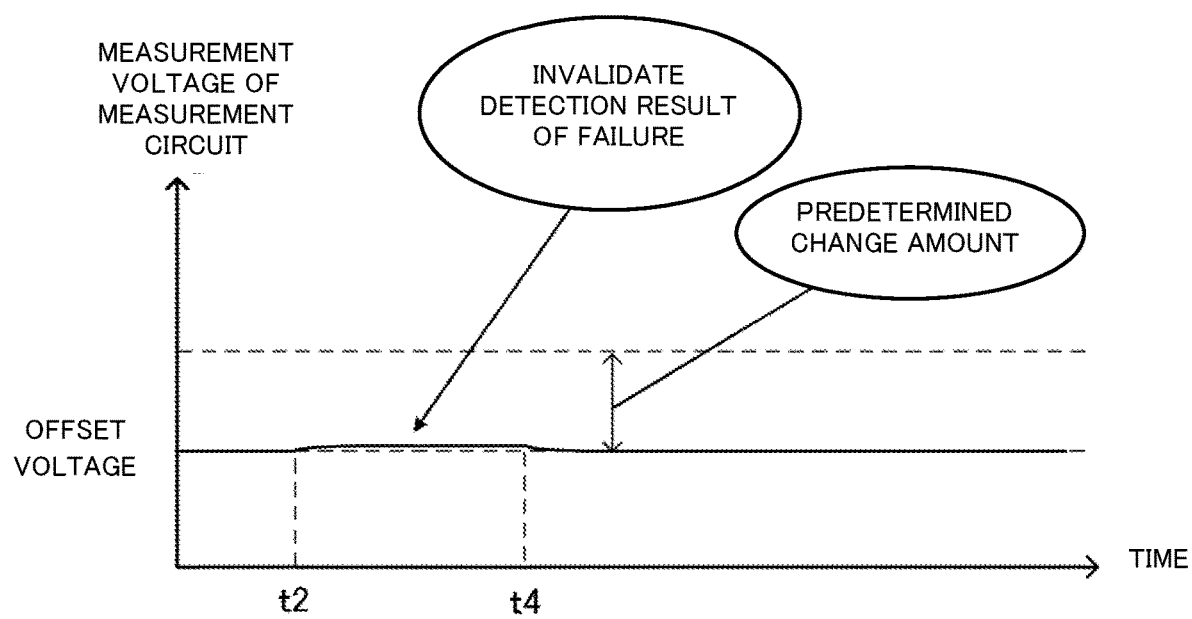
FIG. 10 is an explanation diagram of the inspection method of the capacitors according to the embodiment.

When the resistance values of the insulation resistances 12, 13 are sufficiently high, as illustrated in FIG. 10, the voltage measured by the measurement circuit 25 may hardly change before and after switching from the one measurement process to the other measurement process of the first measurement process, the second measurement process, and the third measurement process.

In this case, even when the capacitors 28, 29 are not open-failed, a time during which the voltage measured by the measurement circuit 25 starts changing and then stabilizes is the predetermined time or less, so that the controller 3 may erroneously determine that the capacitors 28, 29 are open-failed.

Therefore, when a change amount of the voltage measured by the measurement circuit 25 before and after switching from the one measurement process to the other measurement process of the first measurement process, the second measurement process, and the third measurement process is a predetermined change amount or less, the controller 3 invalidates detection results of the failures of the capacitors 28, 29.

The predetermined change amount means that a difference between the measured voltage by the first series-connected circuit R1 and the measured voltage by the second series-connected circuit R2 is small, when switching from one of the first series-connected circuit R1 and the second series-connected circuit R2 to an other one of the first series-connected circuit R1 and the second series-connected circuit R2, the time during which the voltage measured by the measurement circuit 25 starts changing and then stabilizes is the predetermined time or less. A meaning of the phrase "invalidates detection results of the failures" also includes "does not perform failure detection".

As a result, when the resistance values of the insulation resistances 12, 13 are sufficiently high, it is possible to prevent the controller 3 from erroneously determining that the capacitors 28, 29 that are not open-failed are open-failed.

Here, in the state in which the insulation resistance 12 on the positive electrode side and the insulation resistance 13 on the negative electrode side are not deteriorated, the case in which the insulation resistance value of the insulation resistance 12 is the same as the insulation resistance value of the insulation resistance 13 has been described. However, this is merely one example. In the state in which the insulation resistance 12 on the positive electrode side and the insulation resistance 13 on the negative electrode side are not deteriorated, the insulation resistance value of the insulation resistance 12 may be different from the insulation resistance value of the insulation resistance 13.

In this case, a resistance element is connected in series to one of the insulation resistance 12 on the positive electrode side and the insulation resistance 13 on the negative electrode side. Thus, the resistance value of one of the insulation resistance 12 on the positive electrode side and the insulation resistance 13 on the negative electrode side to which the resistance element is connected is higher than the resistance value of an other one of the insulation resistance 12 on the positive electrode side and the insulation resistance 13 on the negative electrode side.

Here, a case in which the resistance element is connected to the insulation resistance 13 on the negative electrode side, that is, a resistance value of a combined resistance obtained by connecting the resistance element in series to the insulation resistance 13 on the negative electrode side is larger than the resistance value of the insulation resistance 12 on the positive electrode side will be described.

In this case, in the measurement portion 2, in the normal state in which the capacitors 28, 29 are not disconnected, when switching from the third measurement process to the first measurement process at the time t2, the capacitor 28 is charged. Subsequentially, when switching from the first measurement process to the second measurement process at the time t3, the capacitor 28 is discharged, and the capacitor 29 is charged. Subsequentially, when switching from the second measurement process to the third measurement process at the time t4, the capacitor 29 is discharged.

Figure 11:
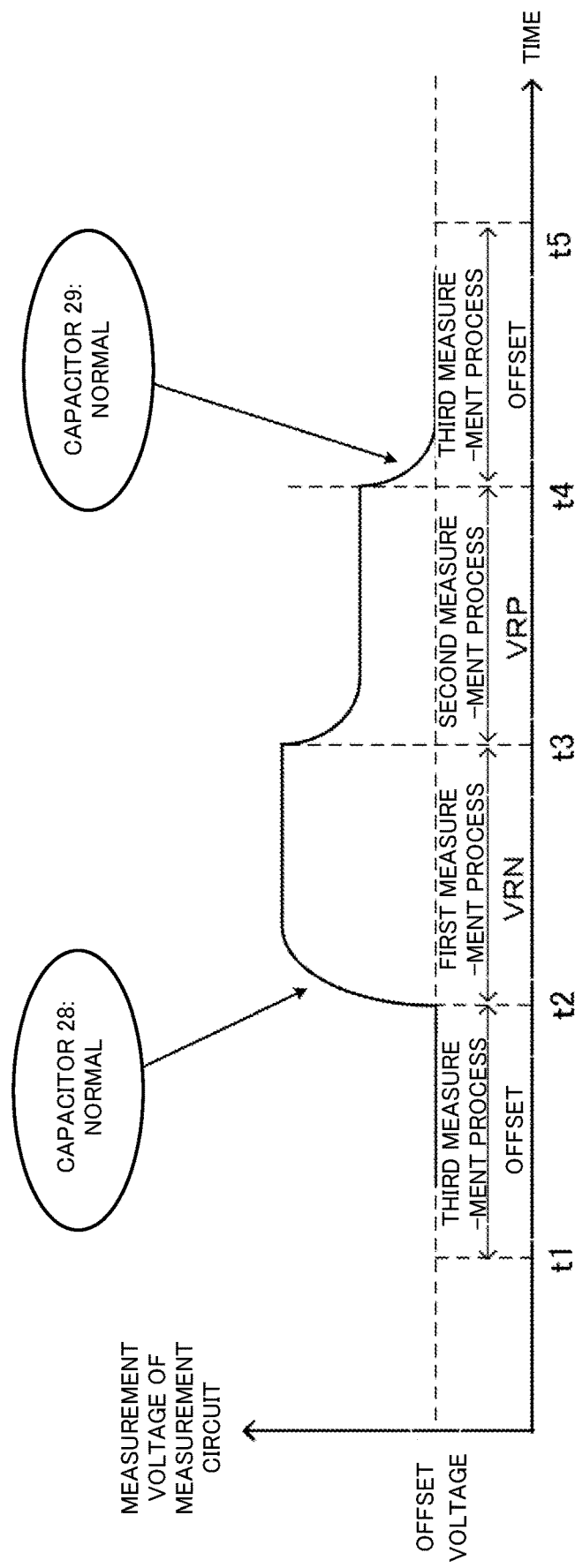
FIG. 11 is an explanation diagram of the inspection method of the capacitors according to the embodiment.

Thus, when the capacitors 28, 29 are in the normal state, as illustrated in FIG. 11, the measured voltage gradually increases from the time t2 to a completion of the charge of the capacitor 28. Furthermore, the measured voltage gradually decreases from the time t3, but does not decrease to the offset voltage. Moreover, the measured voltage gradually decreases from the time t4 to a completion of the discharge of the capacitor 29.

Therefore, when the measured voltage gradually increases from the time t2, the controller 3 determines that the capacitor 28 is normal. Furthermore, when the measured voltage gradually decreases from the time 4, the controller 3 determines that the capacitor 29 is normal.

Figure 12:
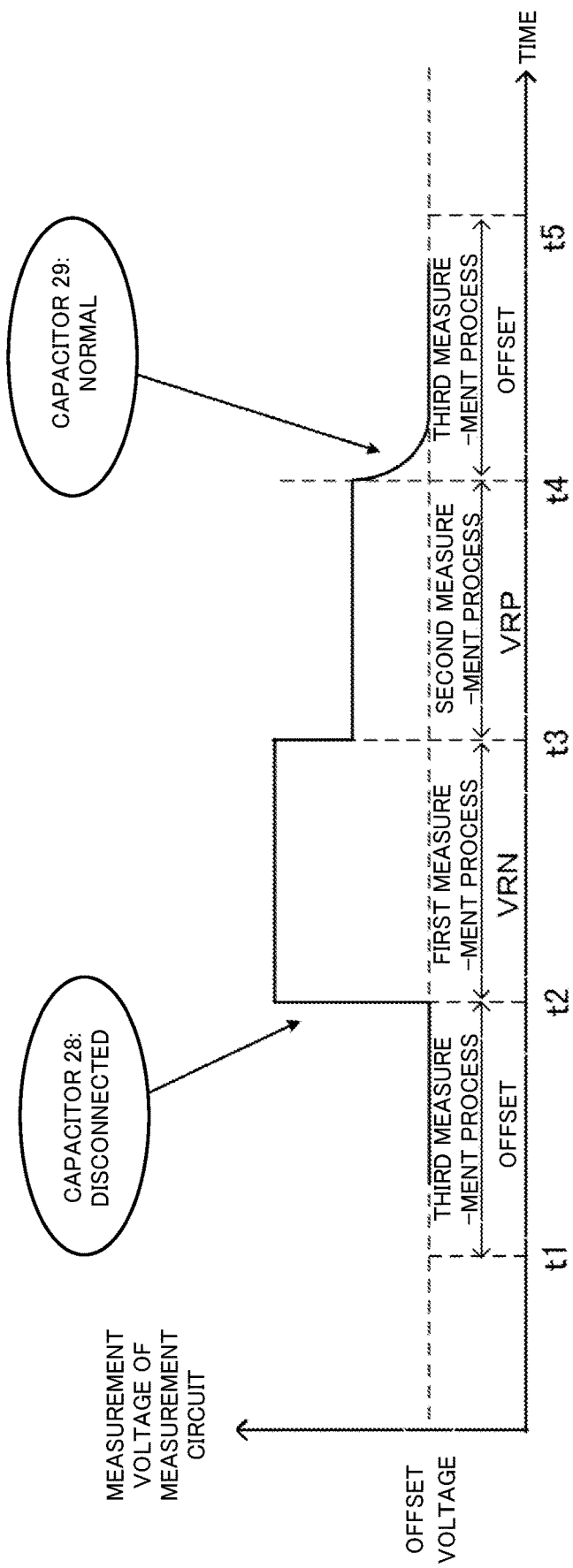
FIG. 12 is an explanation diagram of the inspection method of the capacitors according to the embodiment.

On the other hand, for example, when the capacitor 28 is disconnected, as illustrated in FIG. 12, the measured voltage rapidly increases at the time t2 because the capacitor 28 is not charged. Furthermore, the measured voltage rapidly decreases at the time t3. Therefore, when the measured voltage rapidly increases at the time t2, and rapidly decreases at the time t3, the controller 3 determines that the capacitor 28 is disconnected.

Figure 13:
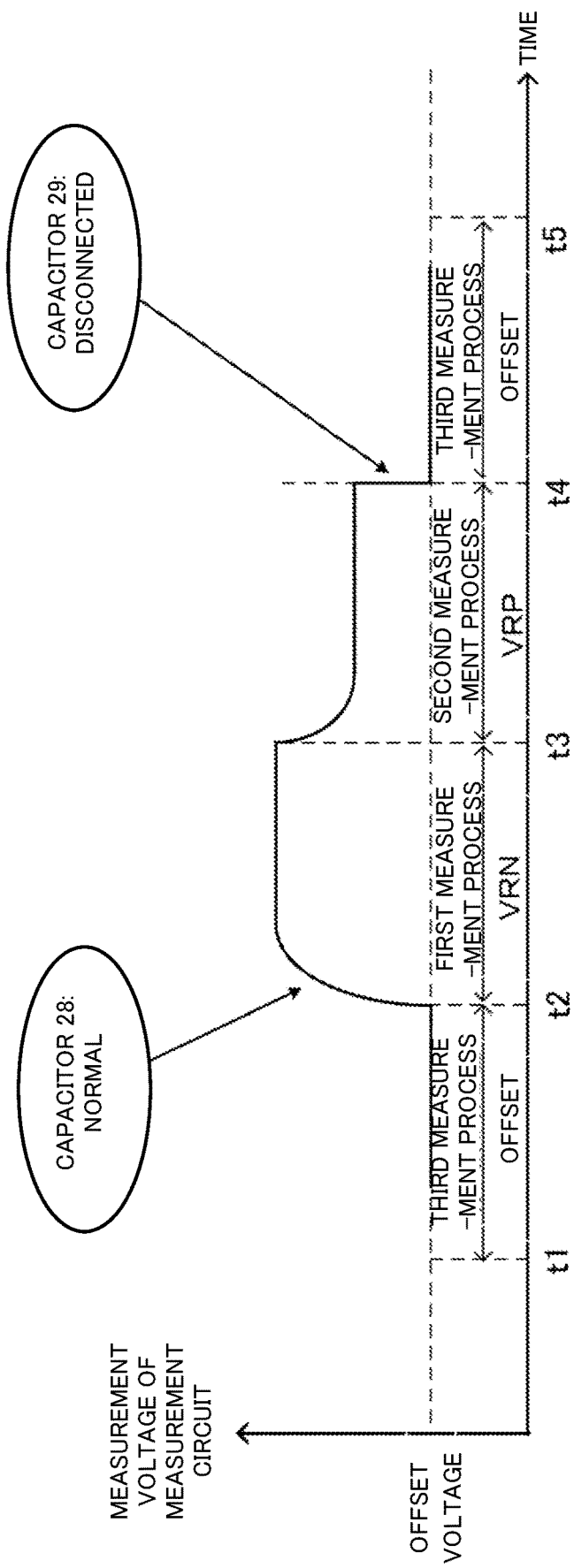
FIG. 13 is an explanation diagram of the inspection method of the capacitors according to the embodiment.

For example, when the capacitor 29 is disconnected, as illustrated in FIG. 13, the measured voltage rapidly decreases at the time t4 because the capacitor 28 is not discharged. Therefore, when the measured voltage rapidly decreases at the time t4, the controller 3 determines that the capacitor 29 is disconnected.

4. Process Executed by Controller

Next, a process executed by the controller 3 will be described with reference to FIG. 14 to FIG. 17. Each of FIG. 14 to FIG. 17 is a flowchart illustrating one example of the process executed by the controller 3 according to the embodiment. The controller 3 repeatedly executes the process illustrated in FIG. 14 in a period during which a power supply of the vehicle is turned on.

Figure 14:
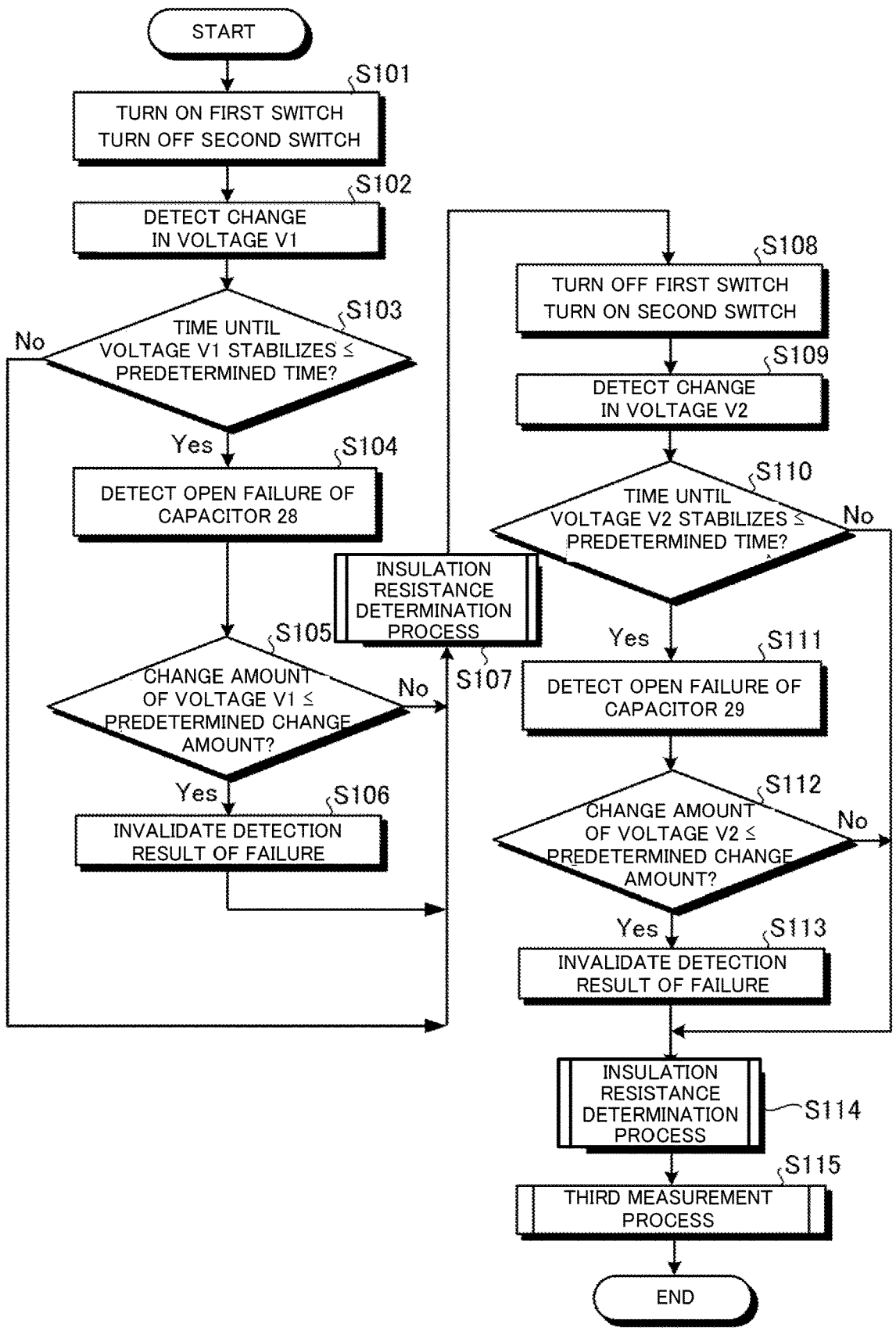
FIG. 14 is a flowchart illustrating one example of a process executed by a controller according to the embodiment.

Specifically, as illustrated in FIG. 14, the controller 3 first turns on the first switch 21, and turns off the second switch 22 to form the first series-connected circuit R1 (a step S101). Then, the controller 3 detects the first voltage V1 applied to the detection resistance 23 (a step S102).

Subsequently, the controller 3 determines whether or not the time until the first voltage V1 stabilizes is the predetermined time or less (a step S103). When the controller 3 has determined that the time until the first voltage V1 stabilizes is not the predetermined time or less (No in the step S103), the controller 3 determines that the capacitor 28 is normal and moves the process to a step S107.

When the controller 3 has determined that the time until the first voltage V1 stabilizes is the predetermined time or less (Yes in the step S103), the controller 3 detects an open failure of the capacitor 28 (a step S104), and determines whether or not a change amount of the first voltage V1 is the predetermined change amount or less (a step S105).

When the controller 3 has determined that the change amount of the first voltage V1 is not the predetermined change amount or less (No in the step S105), the controller 3 moves the process to the step S107. When the controller 3 has determined that the change amount of the first voltage V1 is the predetermined change amount or less (Yes in the step S105), the controller 3 invalidates a detection result of the open failure of the capacitor 28 (a step S106).

Subsequently, in the step S107, the controller 3 performs an insulation resistance determination process. One example of the insulation resistance determination process will be described later with reference to FIG. 15. Then, the controller 3 turns off the first switch 21 and turns on the second switch 22 to form the second series-connected circuit R2 (a step S108). The controller 3 detects the second voltage V2 applied to the detection resistance 24 (a step S109).

Subsequently, the controller 3 determines whether or not the time until the second voltage V2 stabilizes is the predetermined time or less (a step S110). When the controller 3 has determined that the time until the second voltage V2 stabilizes is not the predetermined time or less (No in the step S110), the controller 3 determines that the capacitor 29 is normal and moves the process to a step S114.

When the controller 3 has determined that the time until the second voltage V2 stabilizes is the predetermined time or less (Yes in the step S110), the controller 3 detects an open failure of the capacitor 29 (a step S111), and determines whether or not a change amount of the second voltage V2 is the predetermined change amount or less (a step S112).

When the controller 3 has determined that the change amount of the second voltage V2 is not the predetermined change amount or less (No in the step S112), the controller 3 moves the process to the step S114. The controller 3 has determined that the change amount of the second voltage V2 is the predetermined change amount or less (Yes in the step S112), the controller 3 invalidates a detection result of the open failure of the capacitor 29 (a step S113), and executes the insulation resistance determination process (the step S114).

Subsequently, the controller 3 executes the third measurement process (a step S115), and ends the process. One example of the third measurement process will be described later with reference to FIG. 16. Next, one example of the insulation resistance determination process executed by the controller 3 in the step S107 and the step S114 will be described with reference to FIG. 15.

Figure 15:
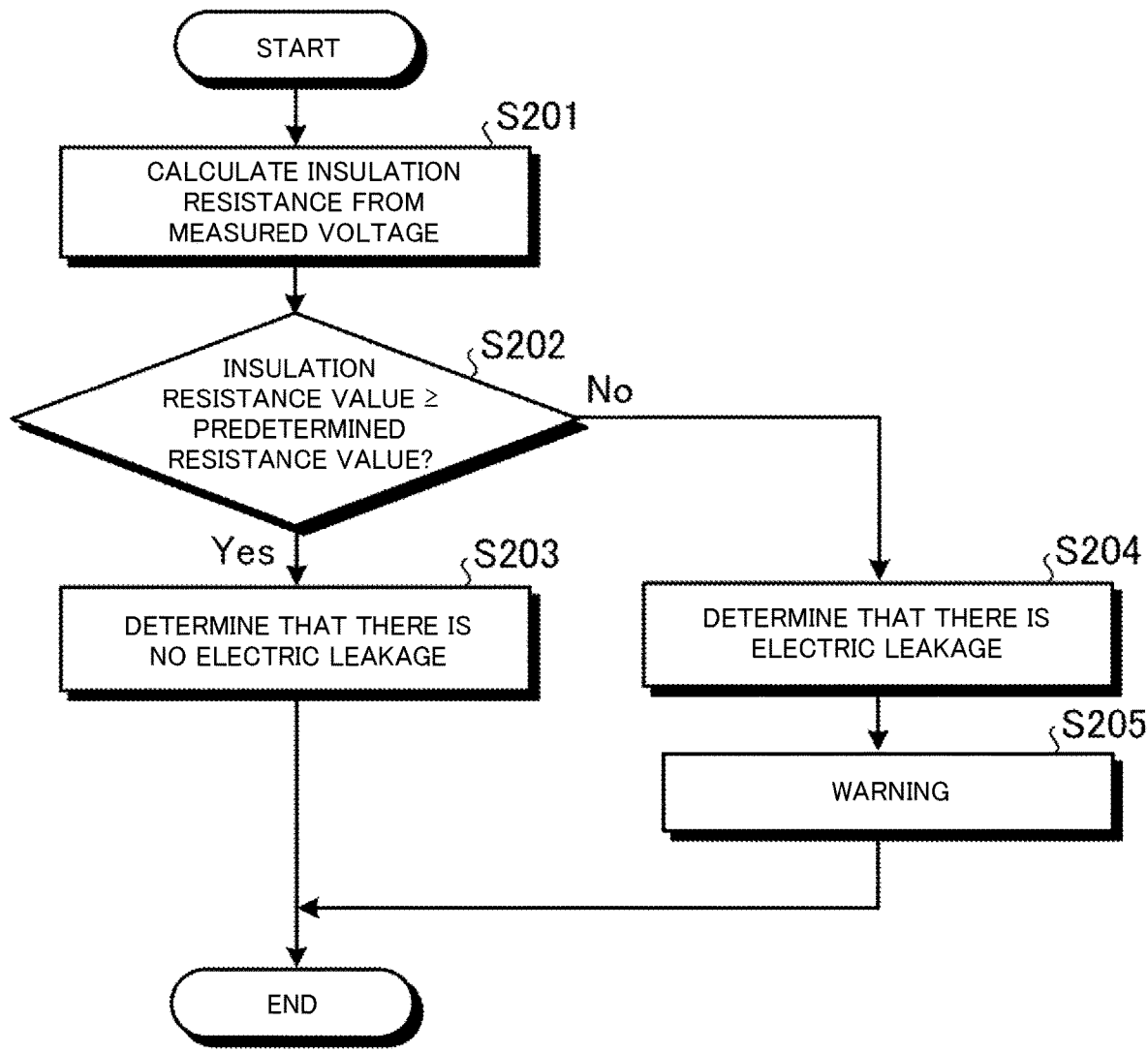
FIG. 15 is a flowchart illustrating one example of the process executed by the controller according to the embodiment.

As illustrated in FIG. 15, the controller 3 calculates a resistance value of an insulation resistance from the voltage measured by the measurement portion 2 (a step S201). At this time, in the insulation resistance determination process of the step S107, the controller 3 calculates the insulation resistance value of the insulation resistance 13 on the negative electrode side from the first voltage V1 detected in the step S102.

Furthermore, in the insulation resistance determination process of the step S114, the controller 3 calculates the insulation resistance value of the insulation resistance 12 on the positive electrode side from the second voltage V2 detected in the step S109. Then, the controller 3 determines whether or not the insulation resistance value is the predetermined resistance value or more that has no problem with an insulation of the battery 10 (a step S202).

When the controller 3 has determined that the insulation resistance value is the predetermined resistance value or more (Yes in the step S202), the controller 3 determines that there is no electric leakage (a step S203), and ends the insulation resistance determination process.

Furthermore, in the step S202, when the controller 3 has determined that the insulation resistance value is not the predetermined resistance value or more (No in the step S202), the controller 3 determines that there is an electric leakage (a step S204). Then, the controller 3 warns a user about the electric leakage (a step S205), and ends the insulation resistance determination process.

Figure 16:
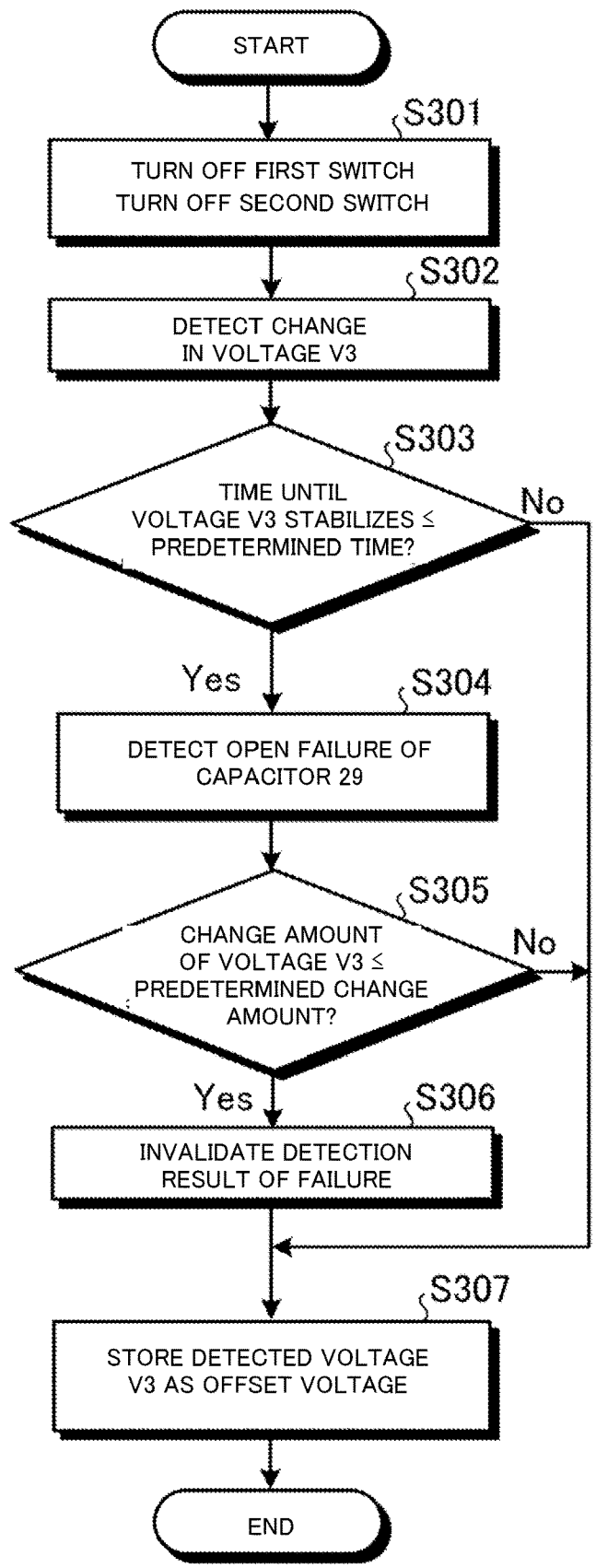
FIG. 16 is a flowchart illustrating one example of the process executed by the controller according to the embodiment.

Next, the third measurement process will be described with reference to FIG. 16. As illustrated in FIG. 16, when the controller 3 starts the third measurement process, the controller 3, first, turns off the first switch 21, turns off the second switch 22 (a step S301), and detects the third voltage V3 (a step S302).

Subsequently, the controller 3 determines whether or not the time until the third voltage V3 stabilizes is the predetermined time or less (a step S303). When the controller 3 has determined that the time until the third voltage V3 stabilizes is not the predetermined time or less (No in the step S303), the controller 3 determines that the capacitor 29 is normal, and moves the process to a step S307.

When the controller 3 has determined that the time until the third voltage V3 stabilizes is the predetermined time or less (Yes in the step S303), the controller 3 detects the open failure of the capacitor 29 (a step S304), and determines whether or not a change amount of the third voltage V3 is the predetermined change amount or less (a step S305).

When the controller 3 has determined that the change amount of the third voltage V3 is not the predetermined change amount or less (No in the step S305), the controller 3 moves the process to a step S307. When the controller 3 has determined that the change amount of the third voltage V3 is the predetermined change amount or less (Yes in the step S305), the controller 3 invalidates the detection result of the open failure of the capacitor 29 (a step S306), stores the detected third voltage V3 as an offset voltage (the step S307), and ends the process.

The third voltage V3 stored in the step S307 is used for calculation of the insulation resistance 12 on the positive electrode side and the insulation resistance 13 on the negative electrode side. In the insulation resistance detection apparatus 1, when the first voltage V1 is detected in the first measurement process, the first voltage V1+the third voltage V3 is output from an operational amplifier of the measurement circuit 25. When it is grounded to the earth, the first voltage V1 (+0V) is output from the operational amplifier. However, since the offset voltage is saved, the first voltage V1+the third voltage V3 is output. Thus, the controller 3 detects the first voltage V1+the third voltage V3 as the first voltage V1.

The second measurement process is similar to the first measurement process. The second voltage V2+the third voltage V3 is output from the operational amplifier, and the controller 3 detects the second voltage V2+the third voltage V3 as the second voltage V2. When the controller 3 calculates the insulation resistance, the controller 3 subtracts the third voltage V3 from the first voltage V1 and the second voltage V2, respectively, so as to calculate the true first voltage V1 and the true second voltage V2 excluding the offset voltage.

As a modification example of a detection process of the capacitors in the step S104 to the step S106 illustrated in FIG. 14, the controller 3, for example, may delete the step S106, replace the step S104 with the step S105, and replace "Yes" with "No" in the step S105 to execute the detection process.

Figure 17:
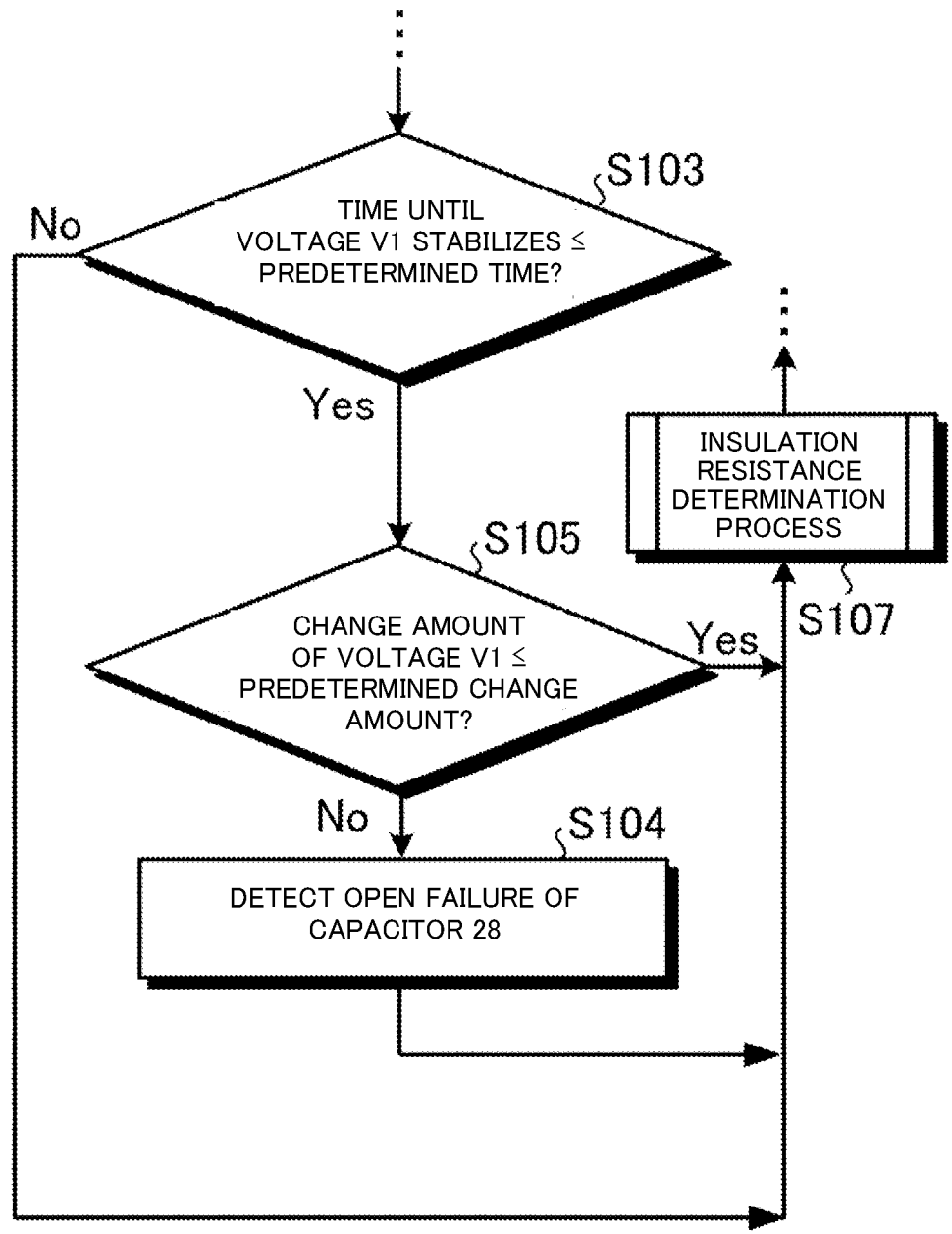
FIG. 17 is a flowchart illustrating one example of the process executed by the controller according to the embodiment.

FIG. 17 is a flowchart illustrating the modification example of the detection process of the capacitors executed by the controller 3 instead of the process from the step S104 to the step S106 illustrated in FIG. 14. As illustrated in FIG. 17, when the controller 3 executes the detection process according to the modification example, in a case of "Yes" in the step S105, the controller 3 moves the process to the step S107, and in a case of "No" in the step S105, the controller 3 moves the process to the step S104. In this case, the controller 3 determines that the time until the first voltage V1 stabilizes is the predetermined time or less (Yes in the step S103). When the controller 3 has determined that the change amount of the first voltage V1 is the predetermined change amount or more (No in the step S105), the controller 3 detects the open failure of the capacitor 28 (the step S104).

Furthermore, when the controller 3 has determined that the time until the first voltage V1 stabilizes is the predetermined time or less (Yes in the step S103), and has determined that the change amount of the first voltage V1 is the predetermined change amount or less (Yes in the step S105), the controller 3 does not perform the process of the step S104 (does not detect the open failure of the capacitor 28). By using this method, the same process as the process of invalidating the detection result of the open failure the capacitor 28 in the step S106 is also performed.

The above-mentioned process changed for the step S104 to the step S106 illustrated in FIG. 14 is also applied to the process from the step S111 to the step S113. That is, the step S113 may be deleted, the step S111 may be replaced with the step S112, and "Yes" may be replaced with "No" in the step S112. Furthermore, the process changed for the step S104 to the step S106 illustrated in FIG. 14 is also applied to the process from the step S304 to the step S306 illustrated in FIG. 16. That is, the step S306 may be deleted, the step S304 may be replaced with the step S305, and "Yes" may be replaced with "No" in the step S305.

5. Modification Example

Next, a measurement circuit 25a according to the modification example of the embodiment will be described with reference to FIG. 18 and FIG. 19. Each of FIG. 18 and FIG. 19 is an explanation diagram of the measurement circuit 25a according to the modification example of the embodiment.

Figure 18:
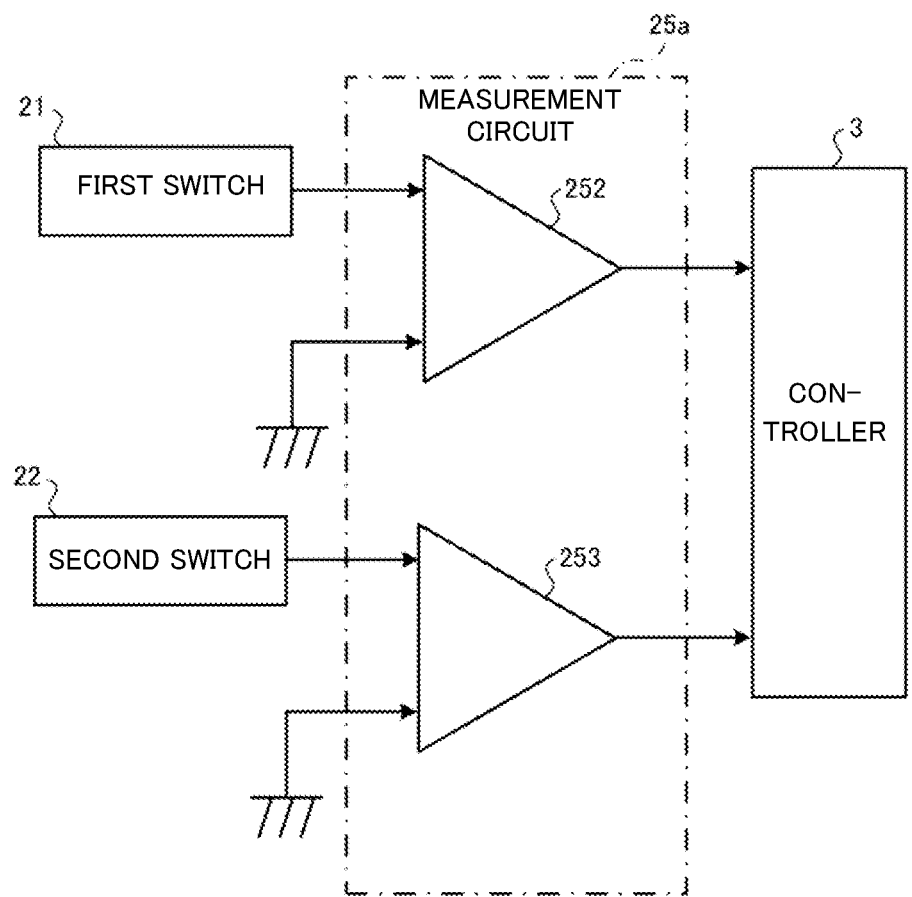
FIG. 18 is an explanation diagram of a measurement circuit according to a modification example of the embodiment.

As illustrated in FIG. 18, the measurement circuit 25a includes a first detector 252 and a second detector 253. The first detector 252 is a differential amplifier that outputs a voltage corresponding to a difference between a voltage of a wire connected to a first switch 21 and a ground voltage to a controller 3. The second detector 253 is a differential amplifier that outputs a voltage corresponding to a difference between a voltage of a wire connected to a second switch 22 and a ground voltage to the controller 3.

As described above, the measurement circuit 25a includes the first detector 252 that detects a first voltage V1 and the second detector 253 that detects a second voltage V2. The first detector 252 and the second detector 253 detect a measurement voltage in a period during which the controller 3 controls the first switch 21 and the second switch 22 according to a measurement schedule illustrated in FIG. 6.

Figure 19:
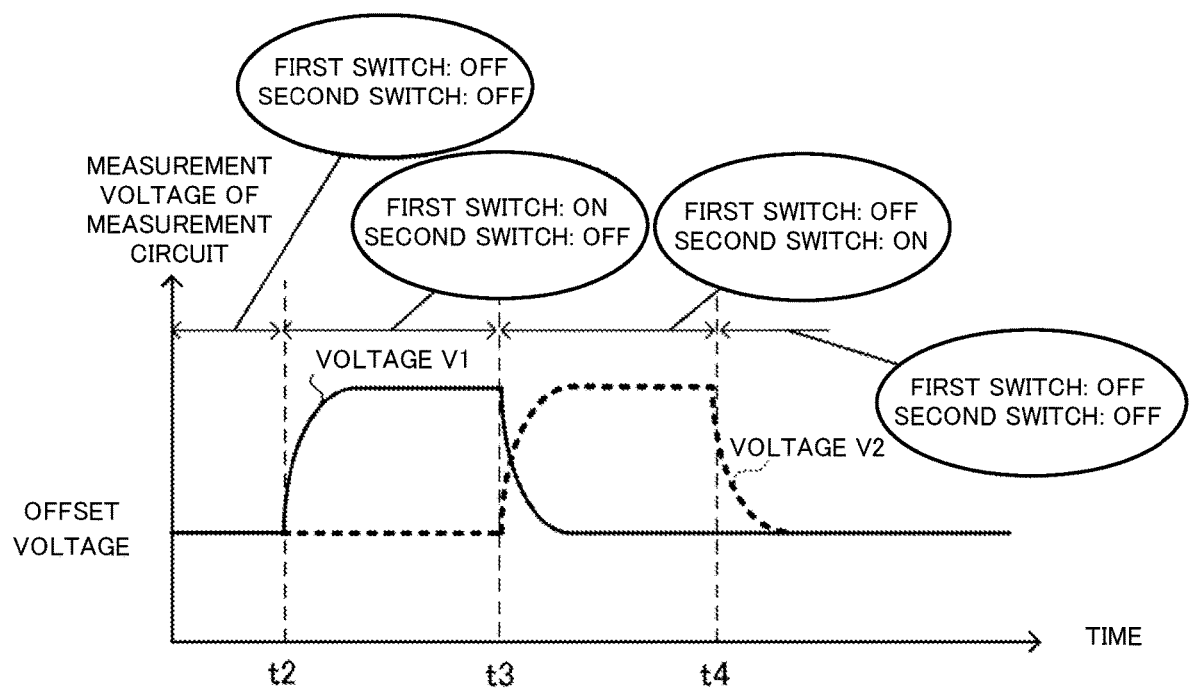
FIG. 19 is an explanation diagram of the measurement circuit according to the modification example of the embodiment.

As a result, the first detector 252 outputs the first voltage V1 shown by a bold solid line in FIG. 19 to the controller 3. On the other hand, the second detector 253 outputs the second voltage V2 shown by a bold dashed line in FIG. 19 to the controller 3.

Therefore, the controller 3 detects a failure of a capacitor 28 based on a change in the measurement voltage from a time t2, detects a failure of a capacitor 29 based on a change in the measurement voltage from a time t4, and further detects the failures of the capacitors 28, 29 based on the measurement voltage at a time t3.

For example, when the first voltage V1 gradually decreases from the time t3, the controller 3 determines that the capacitor 28 is normal. When the first voltage V1 rapidly decreases from the time t3, the controller 3 determines that the capacitor 28 is disconnected. Furthermore, when the second voltage V2 gradually increases from the time t3, the controller 3 determines that the capacitor 28 is normal. When the second voltage V2 rapidly increases from the time t3, the controller determines that the capacitor 29 is disconnected.

As described above, since the controller 3 detects the first voltage V1 and the second voltage V2 separately, even when there is almost no difference between the first voltage V1 and the second voltage V2, and even when a first measurement process and a second measurement process are switched therebetween, the controller 3 accurately detects the failures of the capacitors 28, 29.

It is possible for a person skilled in the art to easily come up with more effects and modifications. Thus, a broader modification of this invention is not limited to specific description and typical embodiments described and expressed above. Therefore, various modifications are possible without departing from the general spirit and scope of the invention defined by claims attached and equivalents thereof.

While the invention has been shown and described in detail, the foregoing description is in all aspects illustrative and not restrictive. It is therefore understood that numerous other modifications and variations can be devised without departing from the scope of the invention.

What is claimed is:

1. A battery voltage measurement circuit comprising:
a first switch configured to be connected to a positive electrode of a battery;
a second switch configured to be connected to a negative electrode of the battery;
detection resistances that are connected in series between the first switch and the second switch;
capacitors that are connected in parallel to the detection resistances; and
a measurement circuit that measures a voltage applied to the detection resistances, wherein
the battery voltage measurement circuit has a plurality of measurement modes depending upon status of the first and second switches, and further has a failure detection mode for the capacitors based on a change in the voltage measured by the measurement circuit after switching from one to an other of the measurement modes, and
the battery voltage measurement circuit has, of the plurality of measurement modes, at least two measurement modes of
(i) a first measurement mode in which (1) the first switch is turned on and the second switch is turned off to form a first series-connected circuit consisting of the battery, one of the detection resistances, and an insulation member on a negative electrode side of the battery that comes into electrical contact with the negative electrode of the battery, and (2) an insulation resistance of the insulation member on the negative electrode side is calculated based on a first voltage measured by the measurement circuit,
(ii) a second measurement mode in which (1) the first switch is turned off and the second switch is turned on to form a second series-connected circuit consisting of the battery, one of the detection resistances, and an insulation member on a positive electrode side of the battery that comes into electrical contact with the positive electrode of the battery, and (2) an insulation resistance of the insulation member on the positive electrode side is calculated based on a second voltage measured by the measurement circuit, and
(iii) a third measurement mode in which (1) the first switch and the second switch are turned off, and (2) an offset voltage is calculated based on a third voltage measured by the measurement circuit.

2. The battery voltage measurement circuit according to claim 1, wherein
after switching from the one to the other of the measurement modes, the battery voltage measurement circuit detects the change in the voltage measured by the measurement circuit a plurality of times in a shorter period than a normal period.

3. The battery voltage measurement circuit according to claim 1, wherein
when a change amount of the voltage measured by the measurement circuit before and after switching from the one to the other of the measurement modes is a predetermined change amount or less, the battery voltage measurement circuit invalidates detection results of failures of the capacitors.

4. The battery voltage measurement circuit according to claim 1, wherein
when a change amount of the voltage measured by the measurement circuit before and after switching from the one to the other of the measurement modes is a predetermined change amount or less, the battery voltage measurement circuit does not detect failures of the capacitors.

5. The battery voltage measurement circuit according to claim 1, wherein
when a time until the voltage measured by the measurement circuit stabilizes after switching from the one to the other of the measurement modes is a predetermined time or less, the battery voltage measurement circuit detects failures of the capacitors.

6. The battery voltage measurement circuit according to claim 1, wherein
the measurement circuit includes a differential amplifier that differentially amplifies the first voltage and the second voltage.

7. The battery voltage measurement circuit according to claim 1, wherein
the measurement circuit includes a first detector that detects the first voltage and a second detector that detects the second voltage.

8. The battery voltage measurement circuit according to claim 1, further comprising a controller that controls the first switch and the second switch, wherein
the controller controls the first switch and the second switch to perform a plurality of measurement processes corresponding to the plurality of measurement modes and the controller detects failures of the capacitors based on the change in the voltage measured by the measurement circuit after switching from one to another of the measurement processes.

9. The battery voltage measurement circuit according to claim 8, wherein
the controller has at least two measurement processes of
(i) a first measurement process in which (1) the first switch is turned on and the second switch is turned off to form the first series-connected circuit consisting of the battery, one of the detection resistances, and the insulation member on the negative electrode side of the battery that comes into electrical contact with the negative electrode of the battery, and (2) the insulation resistance of the insulation member on the negative electrode side is calculated based on the first voltage measured by the measurement circuit,
(ii) a second measurement process in which (1) the first switch is turned off and the second switch is turned on to form the second series-connected circuit consisting of the battery, one of the detection resistances, and the insulation member on the positive electrode side of the battery that comes into electrical contact with the positive electrode of the battery, and (2) the insulation resistance of the insulation member on the positive electrode side is calculated based on the second voltage measured by the measurement circuit, and
(iii) a third measurement process in which (1) the first switch and the second switch are turned off, and (2) the offset voltage is calculated based on the third voltage measured by the measurement circuit.

10. The battery voltage measurement circuit according to claim 8, wherein
after switching from the one to the other of the measurement processes, the controller detects the change in the voltage measured by the measurement circuit a plurality of times in a shorter period than a normal period.

11. The battery voltage measurement circuit according to claim 8, wherein
when a change amount of the voltage measured by the measurement circuit before and after switching from the one to the other of the measurement processes is a predetermined change amount or less, the controller invalidates detection results of the failures of the capacitors.

12. The battery voltage measurement circuit according to claim 8, wherein
when a change amount of the voltage measured by the measurement circuit before and after switching from the one to the other of the measurement processes is a predetermined change amount or less, the controller does not detect the failures of the capacitors.

13. The battery voltage measurement circuit according to claim 8, wherein
when a time until the voltage measured by the measurement circuit stabilizes after switching from the one to the other of the measurement processes is a predetermined time or less, the controller detects the failures of the capacitors.

14. The battery voltage measurement circuit according to claim 9, wherein
the measurement circuit includes a differential amplifier that differentially amplifies the first voltage and the second voltage.

15. The battery voltage measurement circuit according to claim 9, wherein
the measurement circuit includes a first detector that detects the first voltage and a second detector that detects the second voltage.

16. A failure detection method executed by a battery voltage measurement circuit that includes:
a first switch configured to be connected to a positive electrode of a battery;
a second switch configured to be connected to a negative electrode of the battery;
detection resistances that are connected in series between the first switch and the second switch;
capacitors that are connected in parallel to the detection resistances;
a measurement circuit that measures a voltage applied to the detection resistances; and
a controller that controls the first switch and the second switch, the method comprising the steps of:
(a) performing, by the controller, at least two measurement processes of
(i) a first measurement process in which (1) the first switch is turned on and the second switch is turned off to form a first series-connected circuit consisting of the battery, one of the detection resistances, and an insulation member on a negative electrode side of the battery that comes into electrical contact with the negative electrode of the battery, and (2) an insulation resistance of the insulation member on the negative electrode side is calculated based on a first voltage measured by the measurement circuit,
(ii) a second measurement process in which (1) the first switch is turned off and the second switch is turned on to form a second series-connected circuit consisting of the battery, one of the detection resistances, and an insulation member on a positive electrode side of the battery that comes into electrical contact with the positive electrode of the battery, and (2) an insulation resistance of the insulation member on the positive electrode side is calculated based on a second voltage measured by the measurement circuit, and
(iii) a third measurement process in which (1) the first switch and the second switch are turned off, and (2) an offset voltage is calculated based on a third voltage measured by the measurement circuit; and
(b) detecting, by the controller, failures of the capacitors based on a change in the voltage measured by the measurement circuit after switching from one to another of the measurement processes.

* * * * *